United States Patent [19]

Murphy

[11] Patent Number: 5,151,039

[45] Date of Patent: Sep. 29, 1992

[54] INTEGRATED CIRCUIT ADAPTER HAVING GULLWING-SHAPED LEADS

[75] Inventor: James V. Murphy, Warwick, R.I.

[73] Assignee: Advanced Interconnections Corporation, West Warwick, R.I.

[21] Appl. No.: 693,446

[22] Filed: Apr. 29, 1991

Related U.S. Application Data

[63] Continuation-in-part of Ser. No. 505,733, Apr. 6, 1990, abandoned.

[51] Int. Cl.⁵ .............................................. H05K 1/00
[52] U.S. Cl. ....................................... 439/70; 439/638
[58] Field of Search ..................................... 439/68-73, 439/651, 638, 653, 80-83, 632, 876

[56] References Cited

U.S. PATENT DOCUMENTS

| | | | |
|---|---|---|---|
| 4,155,612 | 5/1979 | Silverio | 439/651 |
| 4,354,718 | 10/1982 | Bright | 339/17 CF |
| 4,560,218 | 12/1985 | Billman et al. | 439/70 |
| 4,637,670 | 1/1987 | Coller | 339/46 |
| 4,641,176 | 2/1987 | Kerhuel et al. | 439/72 |
| 4,766,478 | 8/1988 | Dennis | 357/70 |
| 4,907,976 | 3/1990 | Killcommons | 439/72 |

FOREIGN PATENT DOCUMENTS 63-182577  7/1988  Japan .

OTHER PUBLICATIONS

"Advanced Interconnections Catalog #8, Quad. Flat Pack Adaptors" pp. 67–69, 1988.
Advanced Interconnections drawing. 2420-A.
Advanced Interconnections, Letter from Jack Reilly and drawings SK-2265, SK-2264, SK-2263, SK-2262.
Advanced Interconnections, drawings SK-2309 Rev O, SK-2309 Rev 1, and SK-2309 Sheet 20F2.
Letter by Jay Hartvigsen from Motorola to Advanced Interconnections.
Advanced Interconnections, drawings SK-2265, SK-2376, 3049-2A, 3049-2B, 3049-2, FAB3049-2B, 3049, 3093,3049, 3078REF, 3078-A, FAB3078(1 and 2), 3078, 3079, and Motorola, drawing entitled "132 PIN PQFP Adapter PWB".
Quote from Advanced Interconnections to Motorola, Inc.
Letter from Analog Devices; Advanced Interconnections catalog #9, pp. 73 and 77.
Die-Tech. drawings CZ-5700-PKG. Cross Section. CZ-5700-PKG. 150, CZ-5701-PKG. Assy.-DP., and "Die-Tech's Advanced Technologies-One Source for Solutions", promotional item.
Raychem, advertisement for SolderQuick Tape (seven pages).

*Primary Examiner*—David L. Pirlot
*Attorney, Agent. or Firm*—Fish & Richardson

[57] ABSTRACT

An adapter to connect device leads to contacts arranged in a rectangle on a circuit surface. The adapter has a body and leads that extend outwardly, downwardly and then outwardly again in a pair of opposing curves to form feet which match the pattern on the circuit surface. The body has sites for connecting with the device and supports conductive elements connecting the leads to the sites. The adapter may connect gullwing-shaped device leads disposed in a rectangle (e.g., QFP) to contacts in a similar pattern. A substrate, such as a printed circuit board, may support the conductive elements. The conductive elements and adapter leads may be portions of a lead frame with portions of the body molded around them. A connector may provide connections between attachment sites and device leads. This connector may be a separate body, may include socket terminals, and may mate with another connector which has conductive elements for making connections between it and attachment sites on a second body, which may be contact pads for making solder connections to the leads of the device. Strain relief elements are shown. The body may include a stack of connected body portions. The device leads may be anchored in holes in the substrate, and may be bent portions of a lead frame sealed in a molded insulating body.

32 Claims, 12 Drawing Sheets

INTEGRATED CIRCUIT ADAPTER HAVING GULLWING-SHAPED LEADS

CROSS REFERENCE TO RELATED APPLICATIONS

This is a continuation-in-part of copending application Ser. No. 07/505,733 filed on Apr. 6, 1990 abandoned.

BACKGROUND OF THE INVENTION

This invention relates to adapters for interfacing integrated circuits with sockets and printed circuit boards.

Electronic circuits are often built using printed circuit technology. Printed circuit cards generally include plated holes or pads for receiving the leads of an electronic device such as an integrated circuit. Surface mounted devices are mounted on pads on the circuit board and soldered in place. Quad flat pack (QFP) devices include gullwing-shaped leads which project out from four sides of a rectangular package and are soldered to four corresponding rows of pads on the circuit board.

It is known to solder a socket to a printed circuit board to receive a device, thus providing a removable mounting site and electrical connection to the circuit board. Examples of such sockets are presented in Advanced Interconnections Catalog No. 9, (available from 5 Energy Way, West Warwick, RI 02893).

SUMMARY OF THE INVENTION

In general, the invention features an adapter which may connect device leads to contacts, such as pads, arranged in a rectangle on a circuit surface. The adapter has a body and leads that extend outwardly, downwardly and then outwardly again in a pair of opposing curves to form feet which match the pattern on the circuit surface. The body has sites for making connections with the device and supports conductive elements which connect the leads to the sites.

In general, the invention also features an adapter which may connect gullwing-shaped device leads disposed in a rectangle to contacts on a circuit surface in a similar pattern. The adapter has a body with contacts matching the device lead pattern for making connections to the device leads, and leads for making electrical connections to the circuit surface, which extend outwardly, downwardly, and then outwardly again in a pair of opposing curves to form feet that match the circuit surface pattern.

In preferred embodiments, the body is a substrate supporting the conductive elements, such as a printed circuit board; leads are connected to it only by soldering to the outer periphery of its upper surface; the conductive elements and adapter leads are portions of a lead frame and the body is molded around them; a connector connected to the attachment sites makes connections to the device leads; this connector is a separate body; this connector includes socket terminals; this connector mates with another connector which has conductive elements for making connections between it and attachment sites on the second body; the second connector includes connector elements supported in a second body; this second body is separate; attachment sites on the second body are contact pads for making solder connections to the leads of the device; a strain relief element on the adapter allows mechanical connection to the circuit surface; the second body is a printed circuit board; portions of a lead frame form the conductive elements which are molded in the second body; the body includes a stack of connected body portions; an upper portion supports the contacts, leads extend from a lower portion, and the adapter includes separable connectors between them; the adapter is made by soldering leads to the periphery of the upper surface of the circuit board, pressing the leads to the board, and bending them into a gullwing shape; the device is a QFP device.

In general, the invention also features a method of manufacturing an adapter for removably connecting leads of a device to contacts on a circuit surface arranged in a pattern having four rows, one on each side of a rectangular pattern. The method includes the steps of molding a first insulating body, sealing a series of leads in a lead frame to the body, and bending the sealed leads into a gullwing shape corresponding to the pattern.

In preferred embodiments, the step of sealing the leads is performed by heat sealing the lead frames in grooves molded in the body; the step of sealing the leads is performed by means of an adhesive; terminals are embedded in the body, and are electrically connected to the leads; the step of electrically connecting the leads to the terminals is performed by soldering; the step of electrically connecting the leads to the terminals is performed by pressfitting; a second shot molding portion may be molded around the body and sealed leads.

In general, the invention also features an adapter that is to be connected to contacts on a mother circuit surface. The adapter has a circuit bearing element with connection sites that are connected to metalized holes opening onto its top side. Leads are anchored in the holes and bent down around the edge of the top side of the circuit bearing element to below it, and may be connected to the contacts on the mother circuit surface.

In general, the invention also features a method of providing gullwing-shaped leads to a circuit bearing element, in which lead frame elements are provided in a lead frame. The method includes bending the lead frame elements into a hook-shape, soldering them in holes in the circuit bearing element, bending the soldered leads down around the edge of the top surface of the circuit bearing element and below it, and removing a side frame portion from the bent lead frame.

In preferred embodiments, the leads are lead frame elements; the circuit bearing element is a printed circuit board; the leads are soldered to the holes in the circuit bearing element; the leads are bent outwardly below the circuit bearing element to form feet for attachment to the circuit surface; the leads are bent in a gullwing shape with two opposing curves; receptacles are connected to the connection sites and a chimney provides a mounting for the receptacles; a through-hole pin reinforces the mechanical connection between the adapter and the circuit surface; the contacts are arranged in a pattern having four rows of contacts; one row on each side of a rectangular pattern; the corners of the soldered lead frame are removed before the step of bending the soldered leads; the step of removing a side portion from the bent lead frame is performed after the step of bending the soldered leads; the bending operations are performed with bending tools; the steps of bending the soldered leads and cutting the leads are performed in a single operation with a single tool.

An adapter according to the invention allows devices to be interfaced in a variety of ways to a printed circuit board having a gullwing pad configuration. For example, a designer may create a single circuit board which can accept a socket in a prototype or upgradable configuration or a soldered-in device for larger-scale, less expensive production. The designer may also use sockets on boards that were designed with a simple gullwing pad configuration— usually an expensive and time-consuming undertaking. The designer may even interface different device footprints to a gullwing pad configuration if they are more readily available or include other desireable features.

A method of providing leads according to the invention has the advantage of yielding leads that are solidly anchored in plated holes in a circuit bearing element such as a circuit board. A single operation is sufficient to install all of the leads at once, and another single operation bends and cuts all of the leads. Because the leads are bent from the top of the circuit bearing element, the leads are useable with sockets that make contact with the inner surface of the leads, such as those shown in my co-pending application entitled "Integrated Circuit Socket with Reed-Shaped Leads", Ser. No. 616,180, filed Nov. 20, 1990.

DESCRIPTION OF THE PREFERRED EMBODIMENT

We first briefly describe the drawings.

FIG. 1 presents a disassembled side view of an adapter, including the device to be mounted thereon as well as the circuit surface onto which the adapter is to be loaded.

FIG. 2 shows a side view of an adapter mounted on a circuit surface with its associated device.

FIG. 3 presents a disassembled side view of another adapter, including the device to be mounted thereon as well as the circuit surface onto which the adapter is to be loaded.

FIG. 4 presents an assembled side view of the adapter, device and circuit surface of FIG. 3.

Figure 12:
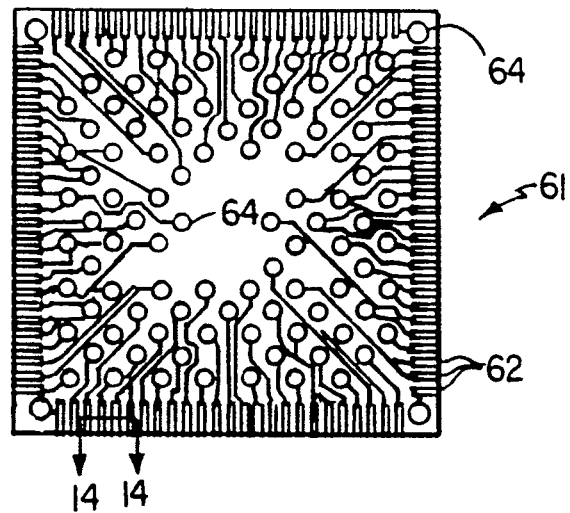
FIG. 12 is a plan view of the bottom surface of the chimney connector body.
Figure 14A:
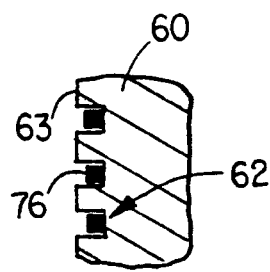
Figure 14B:
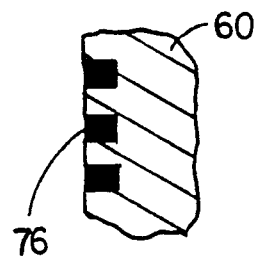

FIGS. 14a and 14b include two sub-figures of a partial cross-section of the chimney connector body as indicated by the arrows in FIG. 12, showing the leads before and after heat is applied to secure them to the chimney connector body.

Figure 15:
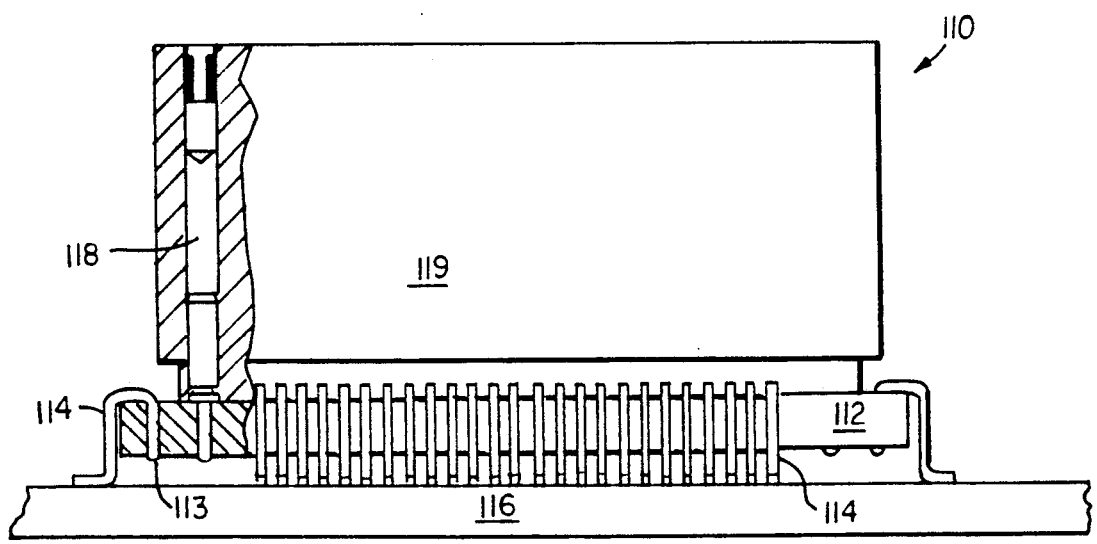

FIG. 15 shows a partially sectioned elevation of an adapter according to the invention.

Figure 16:
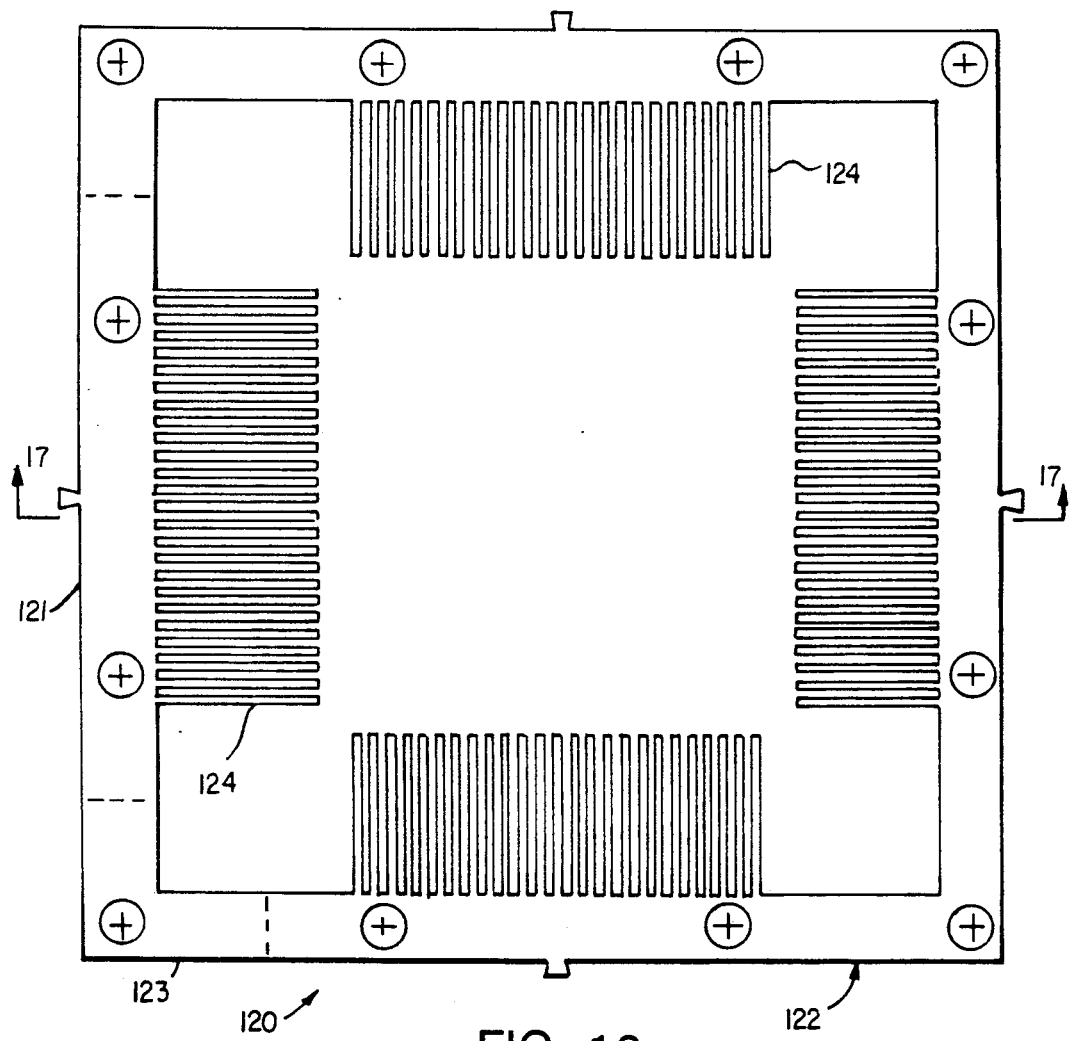

FIG. 16 is a top plan view of a lead frame prior to assembly in the adapter of FIG. 15.

Figure 17:
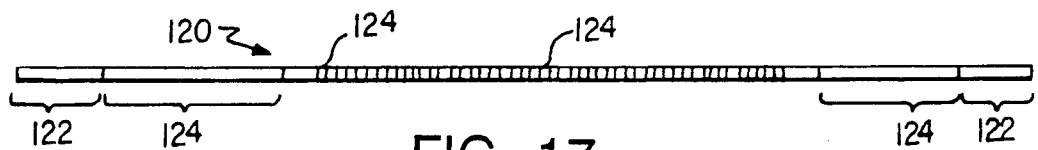

FIG. 17 is a cross-section of the lead frame of FIG. 16 along 17—17, before the bending operations.

Figure 18:
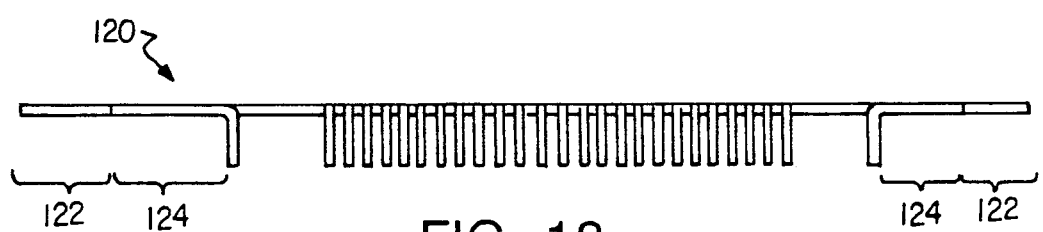

FIG. 18 presents the view of FIG. 17 after the first bending operation.

Figure 19:
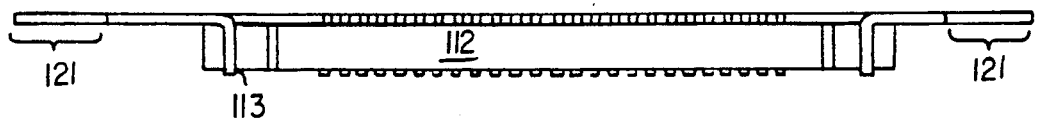

FIG. 19 presents the view of FIG. 17 after the lead frame has been soldered to its printed circuit board element and its corners have been removed.

Figure 20:
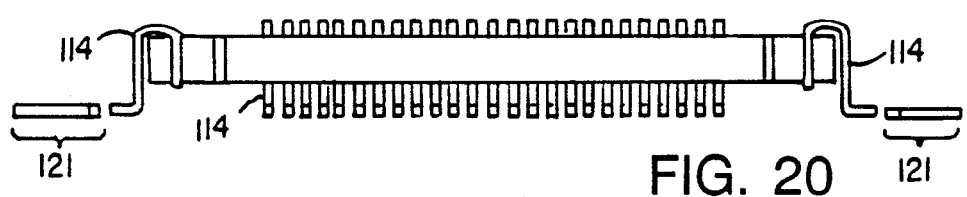

FIG. 20 presents the view of FIG. 17 after the second bending operation, and shows the removal of the frame portions of the lead frame.

Figure 21:
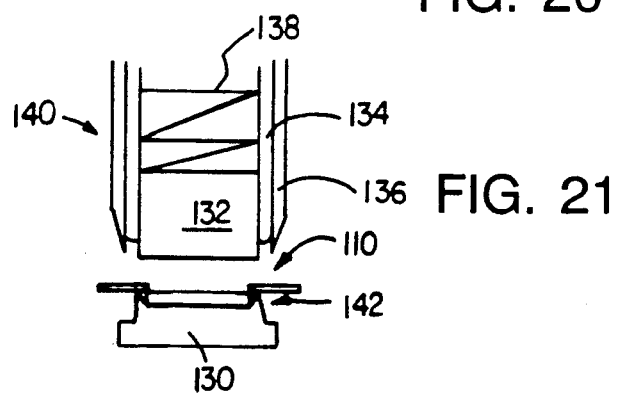

FIG. 21 shows a schematic cross section of a bending apparatus for use in the second bending and cutting operations.

Figure 1:
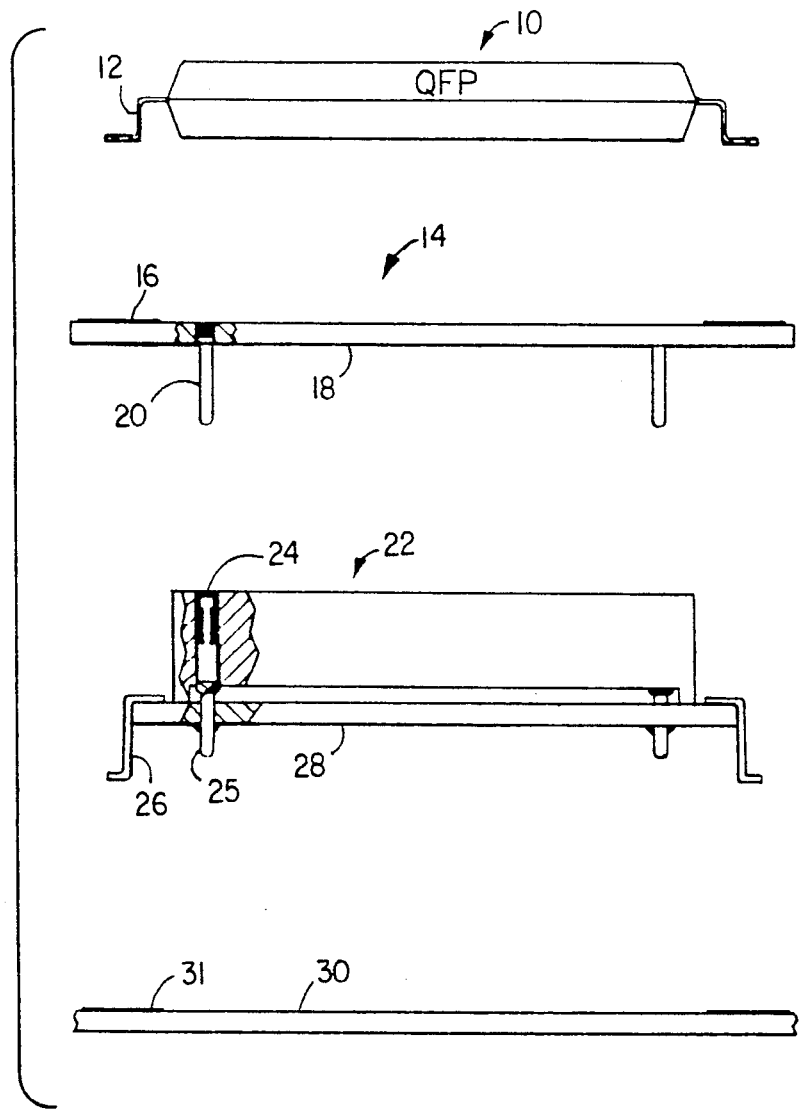

Referring to FIG. 1, a QFP device 10 may be soldered by its leads 12 to a QFP adapter 14. The QFP adapter 14 comprises a QFP adapter printed circuit board 18, pads 16 which are placed to correspond to the device leads, and pins 20. The QFP adapter printed circuit board 18 may be manufactured by printed circuit board fabrication techniques. The pins 20 are press fit into plated-through holes therein and thus connected to the pads 16 by conductive elements (e.g., traces) in the insulative body of the QFP adapter circuit board. The pins 20 may also be soldered to the QFP adapter printed circuit board 18.

The pins 20 of the QFP adapter 14 are spaced to engage terminals 24 in chimney connector 22. Chimney connector 22 is fabricated of insulative material such as glass epoxy or molding compounds, and the terminals 24 are low insertion force socket terminals. The terminals 24 include solder tails 25 which are soldered to electrical attachment sites on adapter substrate 28. Adapter substrate 28 may also be manufactured by printed circuit board fabrication techniques. Also soldered to the adapter substrate 28 are gullwing-shaped adapter leads 26. These gullwing-shaped adapter leads are electrically connected to the electrical attachment sites by conductive elements supported by the insulative body of the adapter substrate 28.

Figure 5:
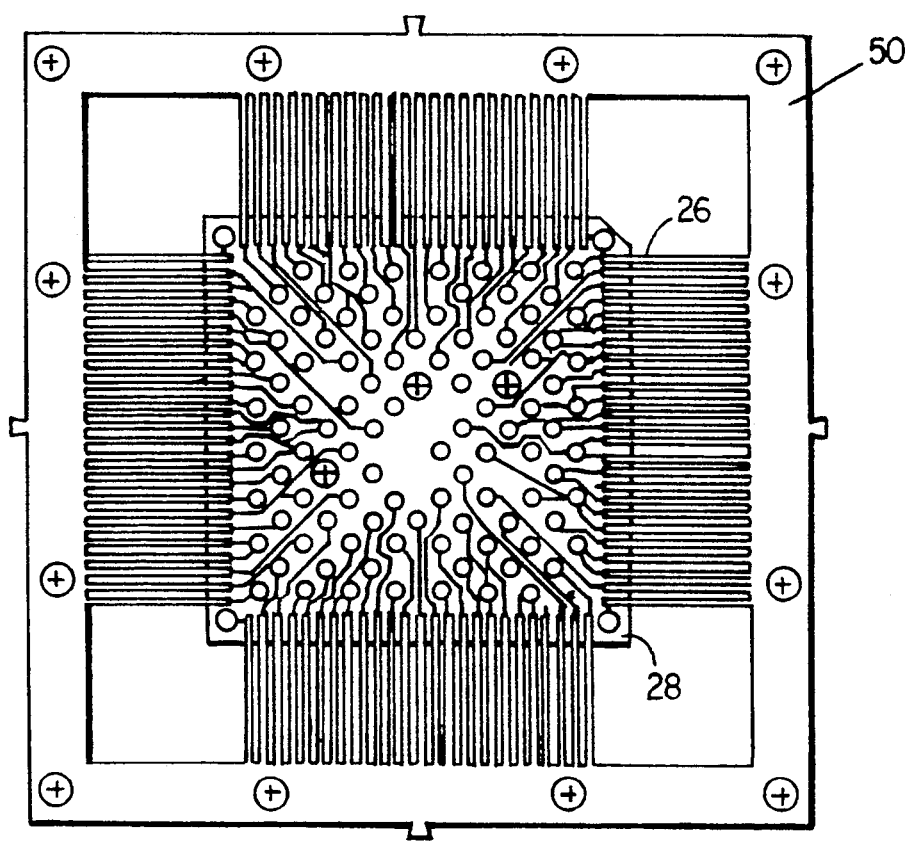
FIGS. 5-10 and 10a show manufacturing steps for the gullwing-shaped leads.
Figure 6:
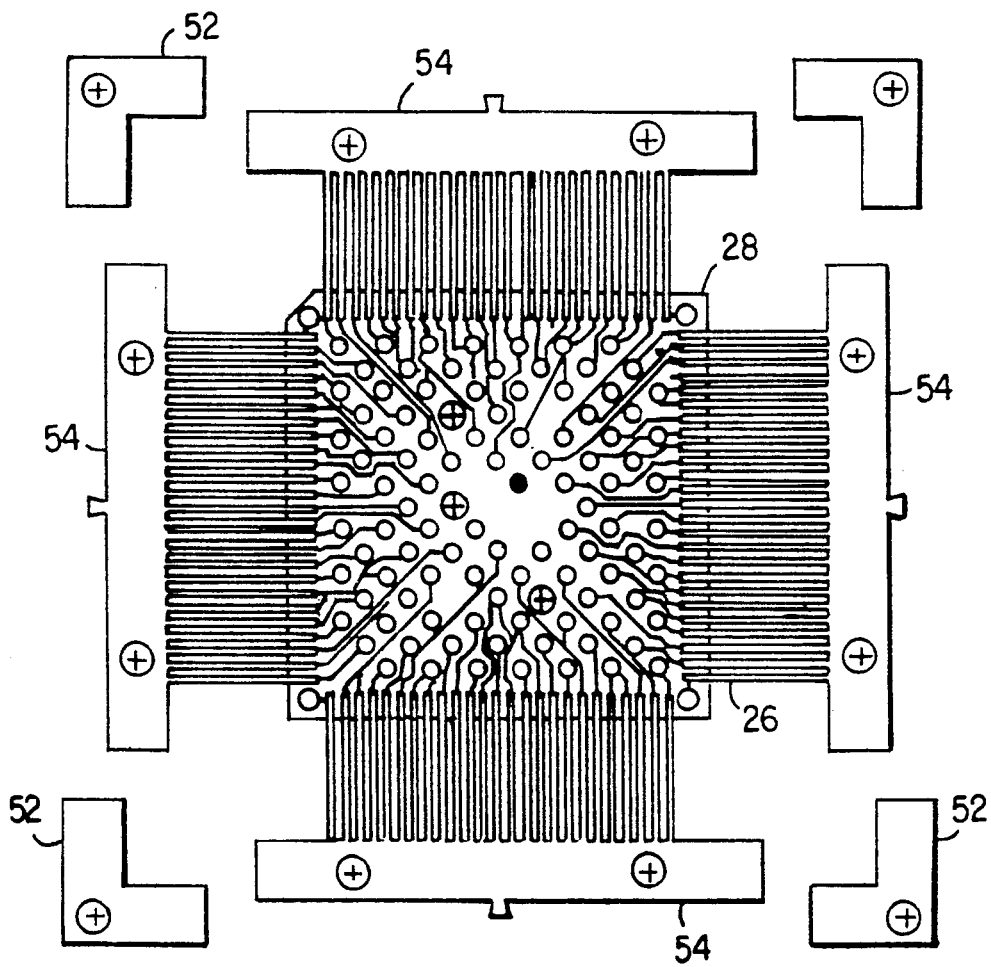
Figure 7:
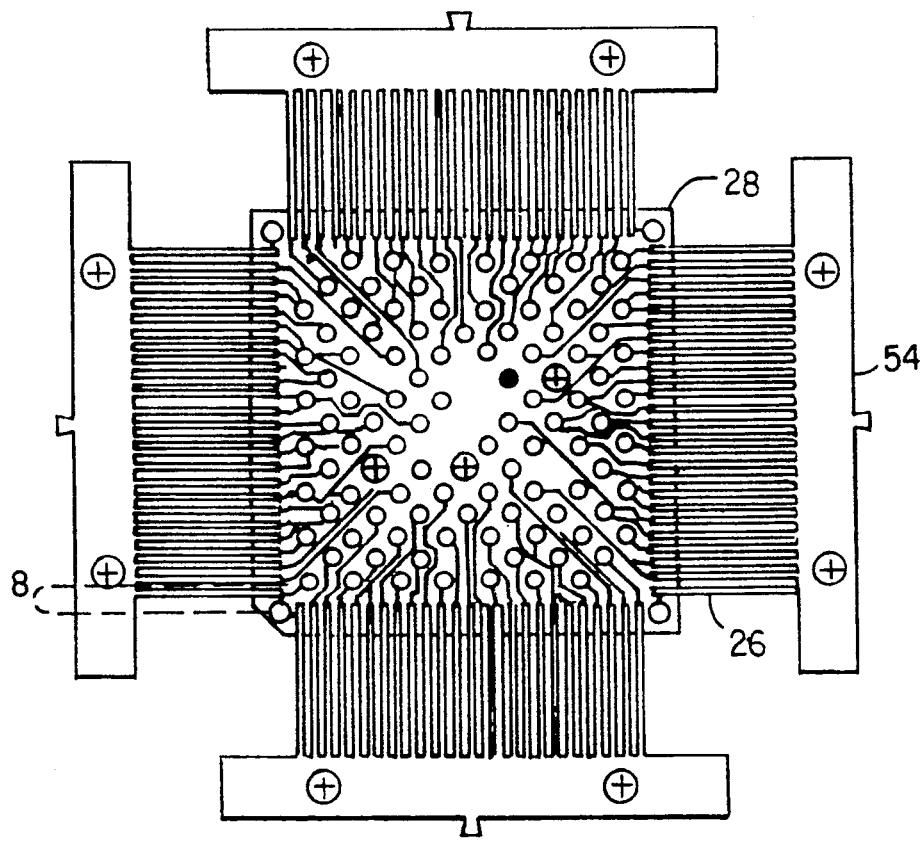
Figure 8:
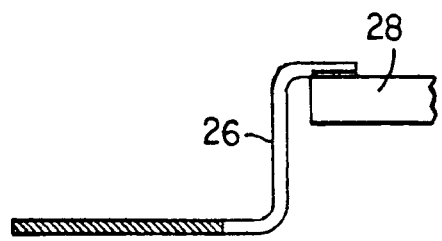
Figure 9:
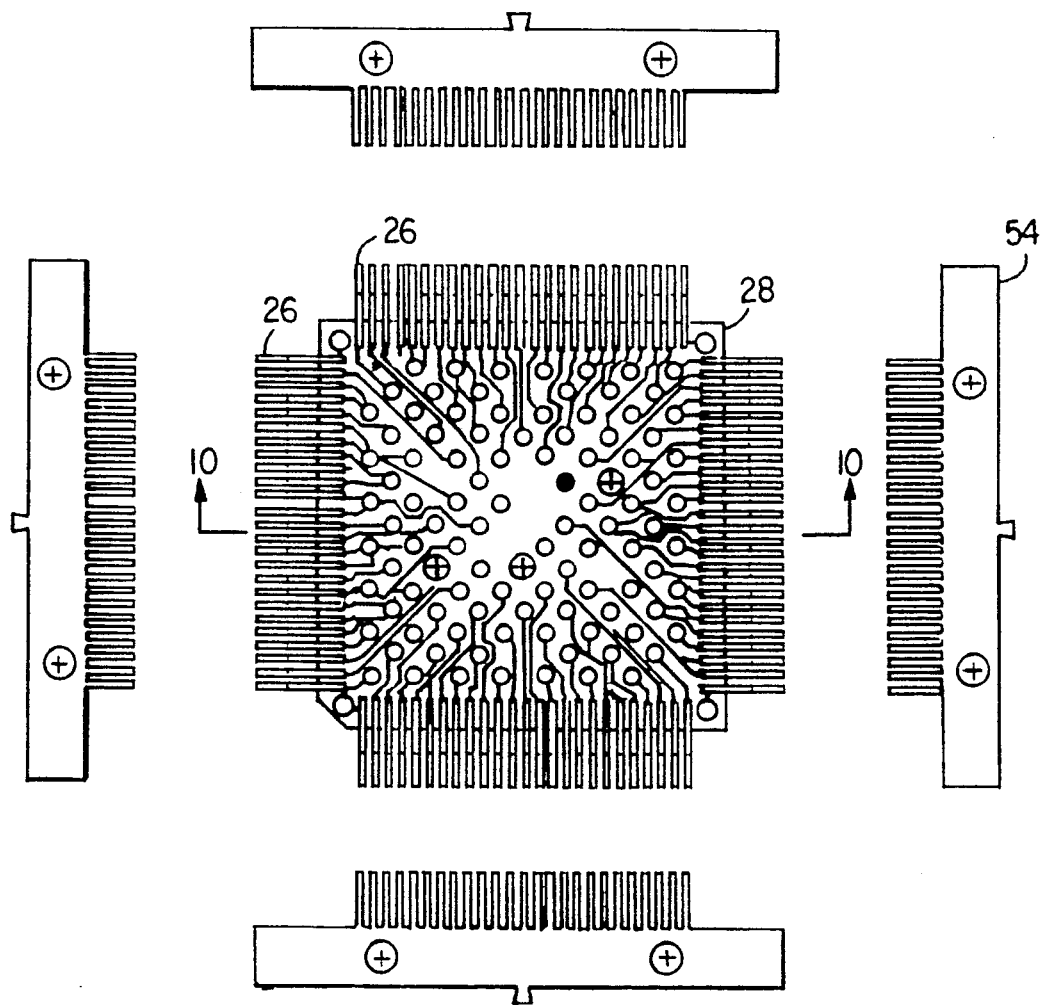
Figure 10:
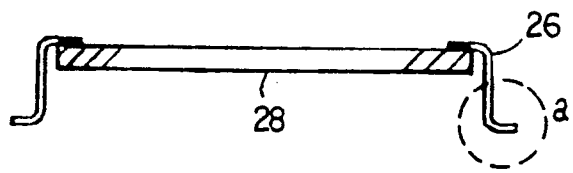
Figure 10A:

As shown in FIG. 5, the gullwing-shaped adapter leads 26 are manufactured from a single lead frame 50 which is soldered to the top surface of adapter substrate 28. The corners 52 of lead frame 50 are then removed (FIG. 6). A jig (not shown) is then pressed onto the top of leads 26 to hold them firmly to adapter substrate 28, and the leads are bent in two different directions to form the opposing curves of a gullwing shape (FIGS. 7 and 8). The jig prevents the solder joints from being subjected to excessive stress during the bending operation. The remainder of the edges 54 of the lead frame 50 are then cut (FIG. 9) to form the final gullwing-shaped adapter leads 26 (FIG. 10).

Figure 2:
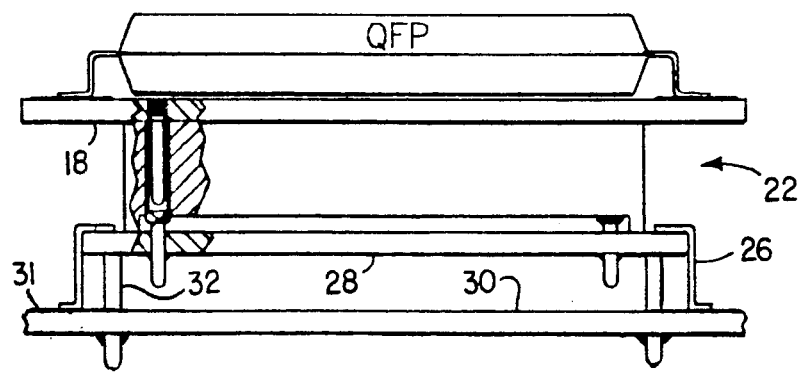

Leads 26 thus include feet adapted to be soldered to standard QFP spaced pads 31 on circuit board surface 30 by the end user with surface mount soldering techniques, as shown in FIG. 2. Strain relief elements 32 may optionally be mounted on the adapter substrate and soldered to the circuit board 31. The strain relief elements may be soldered in holes in the circuit surface as shown in FIG. 2, or shorter strain relief elements may be soldered to pads on the circuit surface.

Once the leads 26 on the adapter substrate are soldered to the circuit board surface 30, the user may insert the QFP adapter 14 with a device 10 soldered to it. To change devices (e.g., for the purpose of experimentation, upgrading or repair), the QFP adapter board may be removed 5 from chimney connector 22 and replaced with another adapter board carrying another device.

Figure 3:
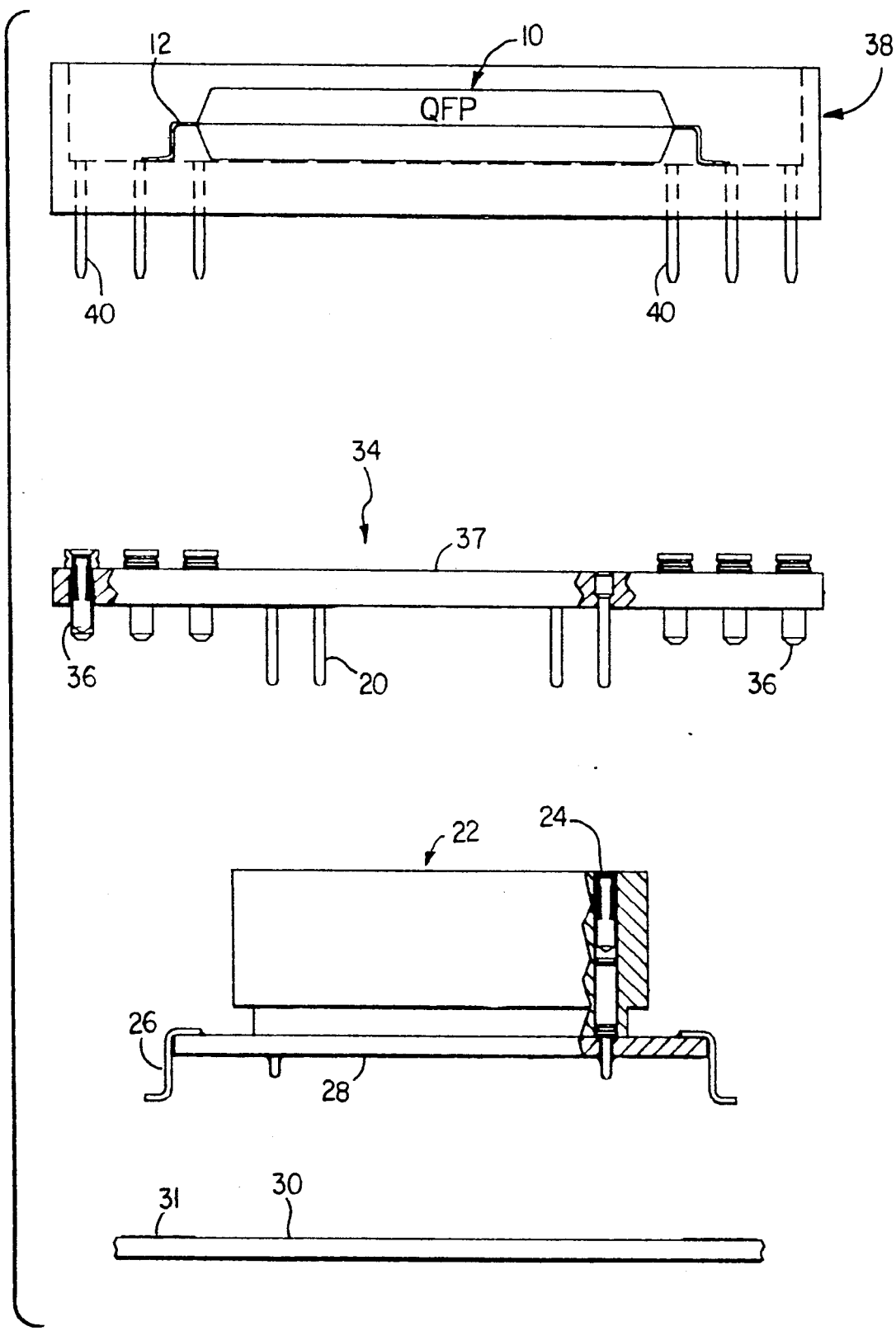

Referring now to FIG. 3, an adapter is presented which is configured to receive a device 10 in a socket 38. Quad flat pack sockets as shown are available from sources such as AMP or 3M. In this embodiment, the socket 38 includes pins 40 which may be inserted in receptacles 36 in the socket adapter 34.

The socket adapter 34 is made up of a socket adapter circuit board 37 which includes pins 20 which are connected to the receptacles 36 by traces in the socket adapter circuit board. Pins 20 are adapted to engage the terminals 24 in the chimney connector 22.

Figure 4:
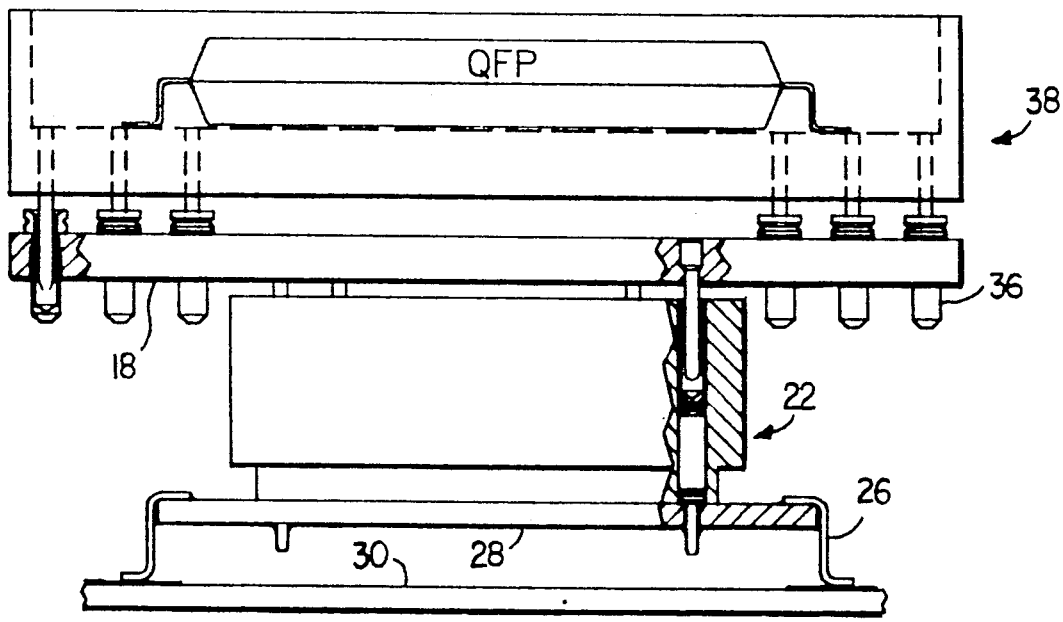

Referring to FIG. 4, once the adapter leads 26 on the adapter substrate 28 are soldered to the circuit board surface 30, the user may insert the socket adapter 34 into the chimney connector 22. A device 10 may then be inserted into the socket 38. To change devices, the device 10 may be removed from socket 38 and replaced with another device.

It should be noted that the socket adapter 34 can be made to have the same pin configuration as the QFP adapter 14 thus making the parts interchangeable on the same chimney connector 22.

If this degree of flexibility is not required, the socket adapter 34 may be directly soldered to the adapter substrate 28 by means of pins 20. Of course, the receptacles 36 should be prevented from touching adapter leads 26 (e.g., by using standoffs). This results in a simpler adapter with a lower profile (not shown).

It is also possible to eliminate receptacles 36 by simply soldering the socket 38 to the socket adapter 34. This will also contribute to a simpler and somewhat lower profile adapter (not shown).

Furthermore, the socket 38 may be a QFP socket, or it may accommodate other device types, such as LCC, PLCC or PGA packages, for example.

Moreover, the parts of the adapter that are implemented with printed circuit boards may be built using embedded lead frames as discussed in my co-pending application, entitled "Molded-in Lead Frames", Ser. Nos. 121,568 and 272,074, which are herein incorporated by reference. For example, in the adapter substrate, the lead frame 50 which is manipulated to form the gullwing-shaped adapter leads may also serve to form conductive elements within the adapter substrate. Such a construction would be less expensive to manufacture than those in which the conductive elements are traces formed using printed circuit board fabrication methods.

The adapter may also be implemented using the molding process discussed in my application entitled "Molded Integrated Circuit Package", Ser. No. 07/564,406, which is herein incorporated by reference.

Figure 11:
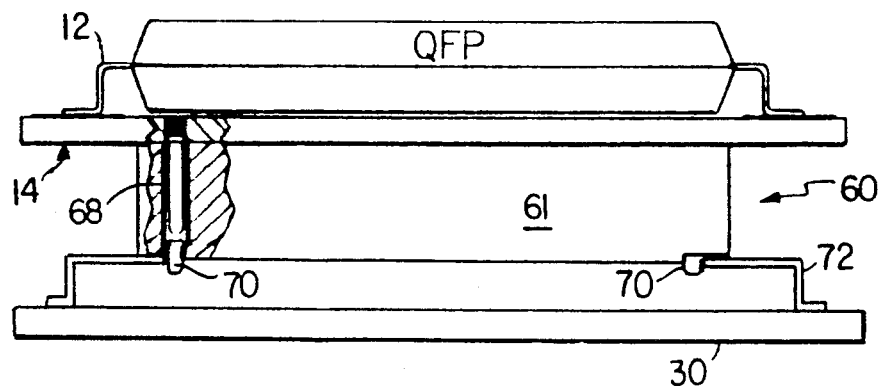
FIG. 11 is a partially sectioned side elevation of an adapter with sealed-in leads that is mounted on a circuit surface with its associated device.

Referring to FIG. 11, the structure of an adapter made using this method includes a plastic molded chimney connector 60 that accepts a QFP adapter 14 and its associated device. Leads are mounted on the lower surface of the plastic molded chimney connector and connected to the terminals 68 within the chimney.

In manufacturing this adapter, a plastic chimney connector body 61 is first molded in a first-shot molding process. As shown in FIG. 12, on the bottom of the body are grooves 62 that each extend from the edge of the body to the bottom of a hole for holding one of the terminals. At the hole, the channel forms an eye-shaped area 64 around the bottom aperture of the hole.

Chimney body 61 is made by injection-molding a high molding pressure plastic, glass-filled polyphenylene sulfide (PPS). This plastic resists the high temperatures present in wave soldering, vapor phase soldering and infra-red soldering. It also has a low affinity for moisture and desirable dielectric properties. This plastic must be molded at high pressures and temperatures, but the molding operation may be relatively short in duration (e.g., around 15 seconds). A typical molding pressure is between 500 and 800 p.s.i.g.

Figure 13:
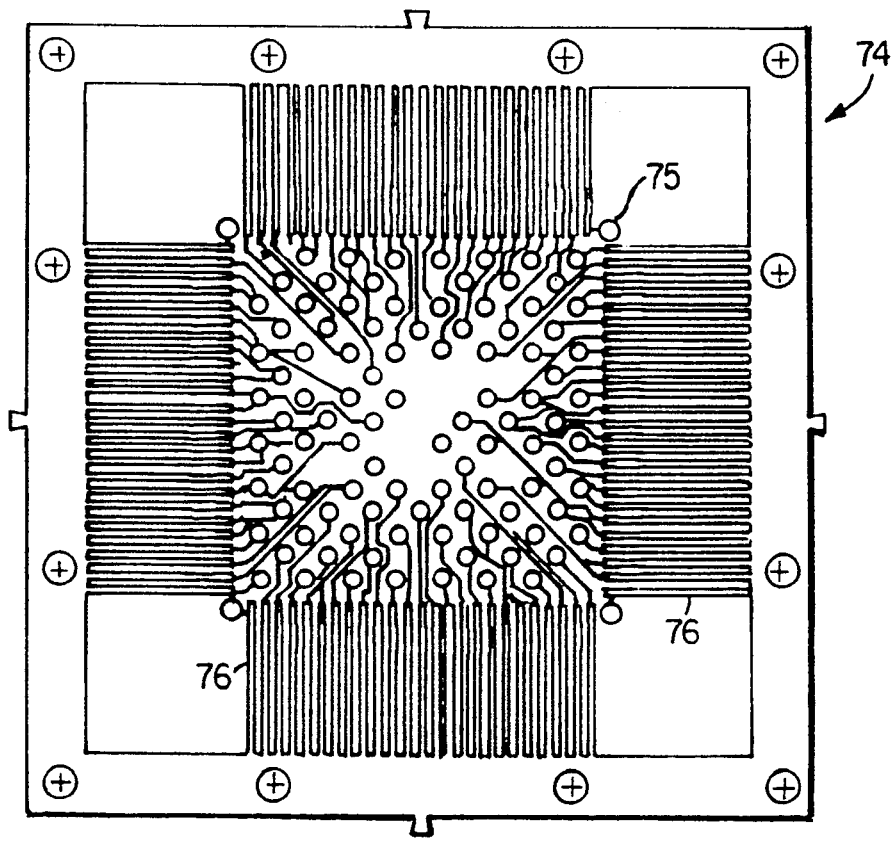
FIG. 13 is a plan view of a lead frame for use with the chimney connector body of FIG. 13.

Referring to FIG. 13, an associated lead frame 74 is then placed on the bottom surface of the body so that each individual lead 76 rests in its corresponding channel 62. It will be observed that eye-shaped portions 75 of the leads will rest in their corresponding eye-shaped areas 64. Referring to FIG. 14a, it can be seen that the ridges 63 between the grooves 62 are thicker than the leads 76 themselves.

FIG. 14b shows the first-shot portion of the body after the second operation. The second operation involves the application of heat to the areas between the grooves by pressing on the first-shot portion using a hot metal iron. This application of heat softens the plastic and causes it to surround the leads and thus secure them to the first-shot portion. Since the ridges between the grooves extend beyond the lead frame, there will be a small amount of excess material that will be pressed so as to fill the small voids between the leads and the walls of the grooves.

In performing this operation, the iron is held at a temperature between 425 and 450 degrees fahrenheit, and applied to the chimney connector body with a force of 30 p.s.i.g.

With the leads secured in place, the terminals 68 may be installed in the chimney and connected to the eyes 75 of the leads 76. The electrical connection may be made by soldering or press-fitting, for example. The lead frame may then be cut and bent to leave the gullwing-shaped leads. This may require applying a force to hold the leads in place during the bending operation.

If desired, further material can be added to the chimney in a second-shot molding operation. This further material assists in holding the leads in place. It is also possible to glue the lead frames in place instead of heat sealing them.

Referring to FIG. 15, another embodiment of a QFP adapter 110 includes a circuit bearing element, such as a printed circuit board element 112, with plated, or otherwise metalized, holes 113 that accept bent gullwing-shaped leads 114. These leads are soldered to the circuit board element at one end and include feet at the other end which may be soldered to pads arranged in four rows on a mother circuit board 116 or mounted in a suitable socket (not shown). Other interconnect elements, such as receptacles 118 embedded in chimney 119 are also connected to the circuit board element 112 and allow for connection to external circuitry.

Referring to FIGS. 16 and 17, a lead frame 120 for use in assembling an adapter according to the invention includes a frame portion 122 and lead elements 124. The lead frame may be made by stamping or etching or by any other suitable method.

In assembling an adapter, the lead elements 124 of the lead frame are first bent (FIG. 18) to a hook-shape in a bending apparatus. Once bent, the lead frame ends are inserted in corresponding holes in the printed circuit board 112, and the lead elements are anchored in place, for example, by infra-red soldering (FIG. 19). With the lead frame soldered in place, its corners 123 (FIG. 16) are cut away. The leads are then bent to their final gullwing shape (FIG. 20) in a second bending operation and the remaining side frame portions 121 (FIG. 16) are cut away.

It is observed that it is important to be careful to prevent solder from flowing substantially away from the solder holes along the lead frame during soldering, as this solder may interfere with the second bending operation.

The second bending operation and the cutting operation may be performed in a single operation using a bending apparatus. Referring to FIG. 21, the soldered but unfinished adapter 110 is placed on a pedestal 130, and the bending tool 140 is lowered onto the part. Upon lowering the tool, a spring-loaded jaw 132 first engages the adapter and holds it in place on its pedestal. As the tool continues to descend, four bending implements 136 engage the leads and bend them around bending dies 142 on the pedestal. These dies are designed to guide the leads down around the edges of the top of the printed circuit element and impart them with the opposing curves and feet of a gullwing shape. They are also dimensioned to allow for a certain amount of overbending, so that the leads spring into their specified shape when the implements are retracted. Finally, as the tool reaches the end of its stroke, four blades 136 cut away the remaining side portions 121 (FIG. 16) of the frame portion of the lead frame.

The above manufacturing process has the advantage of performing several steps in a single operation with a single tool. It is, of course, possible to separate the cutting and bending operations into separate individual operations.

The unfinished adapter is now ready for further operations, such as the addition of a chimney 119 and embedded receptacles as shown in FIG. 15. These receptacles may be electrically connected to attachment sites on the printed circuit element. These sites are connected to the leads by circuit elements, such as copper traces within the printed circuit element, thus providing connections between the receptacles and the leads. Through-hole-type pins may also be provided on the adapter, for the purpose of reinforcing the mechanical connection between the adapter and the mother circuit board, when soldered in place.

Ceramic quad flat pack devices may be used with this invention as well as plastic quad flat pack devices (PQFP).

Other embodiments are within the scope of the following claims.

What is claimed is

1. An adapter for removably electrically connecting the device leads of an electronic device to a circuit surface on which there are contacts arranged in a pattern having four rows of contacts, one row on each side of a rectangular pattern, the device leads of the electronic device being disposed in essentially the same rectangular pattern as that of the contacts on the circuit surface, said adapter comprising:

an insulative body bearing electrical attachment sites configured for making electrical connections with said device leads of the electronic device;

a plurality of adapter leads formed from lead frame portions, each said adapter lead extending outwardly from said body and bending downwardly below said body and then further outwardly in a pair of opposing curves to form a foot, said adapter leads together forming feet located in a pattern that matches both said contacts on said circuit surface and the device leads of the electronic device; and a plurality of terminal elements supported by said body and electrically connecting said adapter leads to said electrical attachment sites, said terminal elements being disposed such that each said terminal element lies substantially directly under the electronic device.

2. An adapter for removably electrically connecting the device leads of an electronic device of the type having four rows of gullwing-shaped leads disposed on the sides of a rectangular pattern to a circuit surface on which there are contacts arranged in a pattern having four rows of contacts, one row on each side of a rectangular pattern, said adapter comprising:

a first insulative body;

electrical attachment sites on said body for making electrical connections with said electronic device;

a plurality of lead frame portions, each including an adapter lead extending outwardly from said body and bending downwardly below said body and then further outwardly in a pair of opposing curves, each said adapter lead having ends forming feet located in a pattern matching that of said contacts on said circuit surface; and a conductive element supported by said body and connecting said adapter lead to one of said electrical attachment sites;

a first electrical connector connected at said electrical attachment sites for making connections to said device leads; and a second insulative body with a second series of electrical attachment sites configured for making connections to said gullwing-shaped leads, a second connector, separate from said second body, configured to mate with said first connector, said connector comprising a plurality of electrical connector elements and conductive elements supported on said second body for making electrical connections between said second connector and said second series of electrical attachment sites.

3. An adapter for removably electrically connecting the device leads of an electronic device of the type having four rows of gullwing-shaped leads disposed on the sides of a rectangular pattern to a circuit surface on which there are contacts arranged in a pattern having four rows of contacts, one row on each side of a rectangular pattern, said adapter comprising:

a first insulative body;

electrical attachment sites on said body for making electrical connections with said electronic device;

a plurality of lead frame portions, each including an adapter lead extending outwardly from said body and bending downwardly below said body and then further outwardly in a pair of opposing curves, each said adapter lead having ends forming feet located in a pattern matching that of said contacts on said circuit surface; and a conductive element supported by said body and connecting said adapter lead to one of said electrical attachment sites;

a first electrical connector connected at said electrical attachment sites for making connections to said device leads; and a second insulative body with a second series of electrical attachment sites configured for making connections to said gullwing-shaped leads, a second connector configured to mate with said first connector, conductive elements supported on said second body for making electrical connections between said second connector and said second series of electrical attachment sites, and at least one strain relief element affixed to said adapter for mechanical connection to the circuit surface.

4. An adapter for removably electrically connecting the device leads of an electronic device of the type having four rows of gullwing-shaped leads disposed on the sides of a rectangular pattern to a circuit surface on which there are contacts arranged in a pattern having four rows of contacts, one row on each side of a rectangular pattern, said adapter comprising:

a first insulative body;

electrical attachment sites on said body for making electrical connections with said electronic device;

a plurality of lead frame portions, each including an adapter lead extending outwardly from said body and bending downwardly below said body and then further outwardly in a pair of opposing curves, each said adapter lead having ends forming feet located in a pattern matching that of said contacts on said circuit surface; and a conductive element supported by said body and connecting said adapter lead to one of said electrical attachment sites;

a first electrical connector connected at said electrical attachment sites for making connections to said device leads; and a second insulative body with a second series of electrical attachment sites configured for making connections to said gullwing-shaped leads, a second connector configured to mate with said first connector, said connector comprising a plurality of socket terminals and conductive elements supported on said second body for making electrical connections between said second connector and said second series of electrical attachment sites.

5. An adapter for removably electrically connecting the leads of an electronic device to a circuit surface, wherein said leads are gullwing-shaped leads disposed in four rows, one on each of four sides of a rectangular pattern, and wherein said circuit surface has contacts disposed in essentially the same rectangular pattern as that of the electronic device, said adapter comprising an insulative adapter body;

contacts on said adapter body, said contacts being configured for making electrical connections to the leads of the device and being disposed in a pattern matching that of said device leads;

adapter leads extending from said adapter body for making electrical connections to the circuit surface, each said adapter lead extending outwardly from said adapter body and bending downwardly below said body and then further outwardly in a pair of opposing curves, said adapter leads having ends, and said ends of said adapter leads forming feet located in a pattern matching that of said contacts on said circuit surface; and a plurality of terminal elements supported by said adapter body and electrically connecting said adapter leads to said contacts on said adapter body, said terminal elements being disposed such that each said terminal element lies substantially directly under the electronic device.

6. The adapter of claim 5 wherein said adapter leads are gullwing-shaped.

7. The adapter of claim 5 wherein said electronic device is a quad flat pack device.

8. The subject matter of claim 5 wherein said contacts on the circuit surface are conductive pads.

9. The adapter of claim 5 wherein said adapter body comprises a plurality of body portions electrically connected in a vertical stack.

10. The adapter f claim 9 wherein said adapter body comprises an upper portion on which said contacts are supported and a lower portion from which said adapter leads extend, and wherein said terminal elements comprise electrical connectors providing separable electrical connections between said upper and lower portions.

11. The adapter of claim 5, wherein said adapter body comprises a first insulative body portion;

electrical attachment sites on said body portion for making electrical connections with said electronic device; and conductive elements supported by said body portion and connecting said adapter leads to said electrical attachment sites.

12. The adapter of claim 11 wherein said conductive elements and said adapter leads are portions of a lead frame, and said body portion comprises portions molded around said lead frame.

13. The adapter of claim 11 wherein said conductive elements and said adapter leads are portions of a lead frame, and said lead frame is sealed in said body portion.

14. The adapter of claim 11 wherein said body portion is a substrate on which said conductive elements are supported.

15. The adapter of claim 14 wherein said conductive elements are printed circuit paths and said substrate is a printed circuit board.

16. The adapter of claim 11, wherein said adapter body further comprises a first electrical connector connected at said electrical attachment sites for making connections to said leads of the electronic device.

17. The adapter of claim 16 wherein said first electrical connector comprises a body portion separate from said first body portion.

18. The adapter of claim 16 wherein said first electrical connector comprises said terminal elements, and said terminal elements comprise a plurality of socket terminals.

19. The adapter of claim 16 wherein said adapter body further comprises a second insulative body portion with a second series of electrical attachment sites configured for making connections to said gullwing-shaped leads of said device, a second connector configured to mate with said first connector, and second conductive elements supported on said second body portion for making electrical connections between said second connector and said second series of electrical attachment sites.

20. The adapter of claim 19 wherein said second connector comprises a plurality of electrical connector elements supported in said second connector.

21. The adapter of claim 19 wherein said attachment sites on said second body portion are contact pads configured for making solder connections to said gullwing-shaped leads of the device.

22. The adapter of claim 19 wherein said second body portion comprises a printed circuit board and said conductive elements are printed circuit paths on said board.

23. The adapter of claim 19 wherein said conductive elements of said second body portion comprise portions of a lead frame, and said second body portion comprises portions molded around said lead frame.

24. An adapter for removably electrically connecting the leads of an electronic device to a circuit surface, wherein said leads are gullwing-shaped and disposed in four rows, one on each of four sides of a rectangular pattern, and wherein said circuit surface has contacts disposed in essentially the same rectangular pattern as that of the electronic device, said adapter comprising an insulative adapter body;
contacts on said adapter body, said contacts being configured for making electrical connections to the leads of the device and being disposed in a pattern matching that of said device leads; and
adapter leads extending from said adapter body for making electrical connections to the circuit surface, each said adapter lead extending outwardly from said adapter body and bending downwardly below said body and then further outwardly in a pair of opposing curves, said adapter leads having ends, and said ends of said adapter leads forming feet located in a pattern matching that of said contacts on said circuit surface,
said adapter body comprising
a first insulative body portion;
electrical attachment sites on said body portion for making electrical connections with said electronic device;
conductive elements supported by said body portion and connecting said adapter leads to said electrical attachment sites;
a first electrical connector connected at said electrical attachment sites for making connections to said device leads;
a second insulative body portion with a second series of electrical attachment sites configured for making connections to said gullwing-shaped leads of said device;
a second connector configured to mate with said first connector; and
second conductive elements supported on said second body portion for making electrical connections between said second connector and said second series of electrical attachment sites,
wherein the electronic device is of the type having four rows of gullwing-shaped leads disposed on the sides of a rectangular pattern, and wherein said second connector comprises a body portion separate from said second body portion.

25. An adapter for removably electrically connecting the leads of an electronic device to a circuit surface, wherein said leads are gullwing-shaped and disposed in four rows, one on each of four sides of a rectangular pattern, and wherein said circuit surface has contacts disposed in essentially the same rectangular pattern as that of the electronic device, said adapter comprising an insulative adapter body;
contacts on said adapter body, said contacts being configured for making electrical connections to the leads of the device and being disposed in a pattern matching that of said device leads;
adapter leads extending form said adapter body for making electrical connections to the circuit surface, each said adapter lead extending outwardly from said adapter body and bending downwardly below said body and then further outwardly in a pair of opposing curves, said adapter leads having ends, and said ends of said adapter leads forming feet located in a pattern matching that of said contacts on said circuit surface; and
at least one strain relief element affixed to said adapter for mechanical connection to the circuit surface,
said adapter body comprising
a first insulative body portion;
electrical attachment sites on said body portion for making electrical connections with said electronic device;
conductive elements supported by said body portion and connecting said adapter leads to said electrical attachment sites;
a first electrical connector connected at said electrical attachment sites for making connections to said device leads;
a second insulative body portion with a second series of electrical attachment sites configured for making connections to said gullwing-shaped leads of said device;
a second connector configured to mate with said first connector; and
second conductive elements supported on said second body portion for making electrical connections between said second connector and said second series of electrical attachment sites,
wherein the electronic device is of the type having four rows of gullwing-shaped leads disposed on the sides of a rectangular pattern.

26. An adapter for removably electrically connecting the leads of an electronic device to a circuit surface, wherein said leads are gullwing-shaped and disposed in four rows, one on each of four sides of a rectangular pattern, and wherein said circuit surface has contacts disposed in essentially the sam rectangular pattern as that of the electronic device, said adapter comprising an insulative adapter body;
contacts on said adapter body, said contacts being configured for making electrical connections to the leads of the device and being disposed in a pattern matching that of said device leads; and
adapter leads extending from said adapter body for making electrical connections to the circuit surface, each said adapter lead extending outwardly form said adapter body and bending downwardly below said body and then further outwardly in a pair of opposing curves, said adapter leads having ends, and said ends of said adapter leads forming feet located in a pattern matching that of said contacts on said circuit surface,
said adapter body comprising
a first insulative body portion;
electrical attachment sites on said body portion for making electrical connections with said electronic device;
conductive elements supported by said body portion and connecting said adapter leads to said electrical attachment sites;
a first electrical connector connected at said electrical attachment sites for making connections to said device leads;
a second insulative body portion with a second series of electrical attachment sites configured for making connections to said gullwing-shaped leads of said device;

a second connector configured to mate with said first connector; and second conductive elements supported on said second body portion for making electrical connections between said second connector and said second series of electrical attachment sites, wherein the electronic device is of the type having four rows of gullwing-shaped leads disposed on the sides of a rectangular pattern, and wherein said second connector comprises a plurality of socket terminals.

27. An adapter for removably electrically connecting the gullwing-shaped leads of a quad flat pack electronic device to a circuit surface, wherein said leads are disposed in four rows, one on each of four sides of a rectangular pattern, and wherein said circuit surface has contacts disposed in essentially the same rectangular pattern as that of the electronic device, said adapter comprising a first insulative body bearing electrical attachment sites, adapter leads extending from said first insulative body for making electrical connections to the circuit surface, each said adapter lead extending outwardly from said adapter body and bending downwardly below said body and then further outwardly in a pair of opposing, gullwing-shaped curves, said adapter leads having ends, and said ends of said adapter leads forming feet located in a pattern matching that of said contacts on said circuit surface, first conductive elements supported by said first insulative body and connecting said adapter leads to said electrical attachment sites, a chimney connector including a plurality of receptacles connected to said attachment sites in said first insulative body, a second insulative body with a second plurality of electrical attachment sites configured for making connection to said gullwing-shaped leads of said quad flat pack device, a plurality of posts supported by said second body and configured to mate with said receptacles, second conductive elements supported on said second body for making electrical connections between said posts and said second plurality of electrical attachment sites, and at least one strain relief element affixed to said adapter for mechanical connection to the circuit surface.

28. An adapter for removably electrically connecting the gullwing-shaped leads of a quad flat pack electronic device to a circuit surface, wherein said leads are disposed in four rows, one on each of four sides of a rectangular pattern, and wherein said circuit surface has contacts disposed in essentially the same rectangular pattern as that of the electronic device, said adapter comprising a first insulative body bearing electrical attachment sites, adapter leads extending from said first insulative body for making electrical connections to the circuit surface, each said adapter lead extending outwardly from said adapter body and bending downwardly below said body and then further outwardly in a pair of opposing, gullwing-shaped curves, said adapter leads having ends, and said ends of said adapter leads forming feet located in a pattern matching that of said contacts on said circuit surface, first conductive elements supported by said first insulative body and connecting said adapter leads to said electrical attachment sites, a chimney connector including a first plurality of receptacles connected to said attachment sites in said first insulative body, a second insulative body bearing a second plurality of receptacles, a first plurality of posts configured to mate with said first plurality of receptacles, and second conductive elements supported on said second body for making electrical connections between said first plurality of posts and said second plurality of receptacles, and a third insulative body bearing a second plurality of posts for connection to said second plurality of receptacles, and a plurality of electrical connection sites configured for making connections to said gullwing-shaped leads of said quad flat pack device, said connection sites and said posts being electrically connected.

29. The adapter of claim 28 wherein said first conductive elements in said first body are printed circuit paths and said first insulative body is a printed circuit board.

30. The adapter of claim 28 wherein said first conductive elements in said first body and said adapter leads are portions of a lead frame, and said body comprises portions molded around said lead frame.

31. The adapter of claim 28 further including at least one strain relief element affixed to said adapter for mechanical connection to the circuit surface.

32. The adapter of claim 28 wherein said connection sites on said third body are contact pads configured for making solder connections to said gullwing-shaped leads of the device.

* * * * *